United States Patent [19]

Suzuki et al.

[11] Patent Number: 4,752,915

[45] Date of Patent: Jun. 21, 1988

[54] TWO DIMENSIONALLY ADDRESSABLE MEMORY APPARATUS WITH BANK SWITCHING

[75] Inventors: Kenji Suzuki; Hiroshi Mochizuki, both of Hadano, Japan

[73] Assignee: Hitachi, Ltd., Tokyo, Japan

[21] Appl. No.: 766,290

[22] Filed: Aug. 16, 1985

[30] Foreign Application Priority Data

Sep. 26, 1984 [JP] Japan .................................. 59-201303

[51] Int. Cl.[4] .......................... G11C 7/00; G11C 8/00; G11C 8/02
[52] U.S. Cl. ...................................... 365/230; 365/231
[58] Field of Search ....................... 360/230, 231, 189

[56] References Cited

U.S. PATENT DOCUMENTS

| | | | |
|---|---|---|---|
| 3,916,169 | 10/1975 | Cochran et al. | 365/104 |
| 4,051,457 | 9/1977 | Inose et al. | 365/118 X |
| 4,074,254 | 2/1978 | Belser et al. | 365/231 |
| 4,153,950 | 5/1979 | Nosowicz et al. | 365/231 |
| 4,410,965 | 10/1983 | Moore | 365/230 |
| 4,585,220 | 4/1986 | Zemke et al. | 365/49 X |

*Primary Examiner*—Stuart N. Hecker
*Assistant Examiner*—Alyssa H. Bowler
*Attorney, Agent, or Firm*—Antonelli, Terry & Wands

[57] ABSTRACT

A memory apparatus is managed by two-dimensional addresses consisting of X and Y addresses and is divided into a plurality of memory banks. One of the memory banks is selected by lower significant bits including the least significant bit in each of the X and Y addresses. A different memory bank is selected by the updating of the X address or by the updating of the Y address.

1 Claim, 4 Drawing Sheets

FIG. 1 PRIOR ART
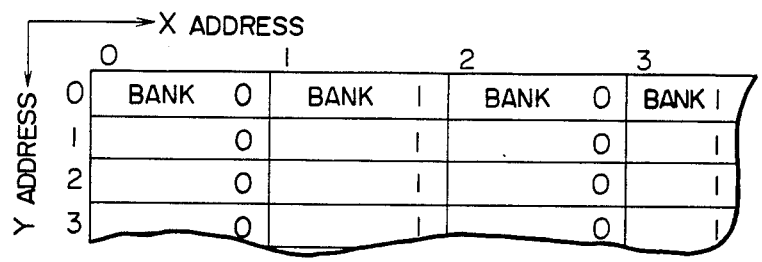
FIG. 2
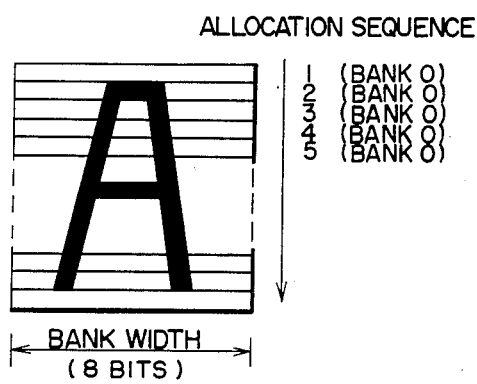
FIG. 3
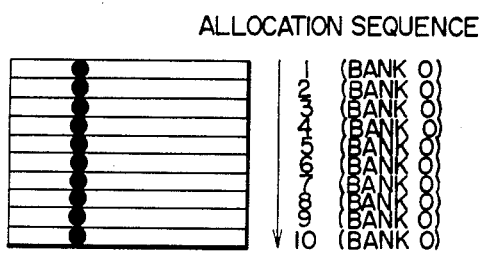
FIG. 4 PRIOR ART

FIG. 8

| X:$2^0$ / Y:$2^0$ | 0 | 1 |
|---|---|---|
| 0 | BANK 0 | BANK 1 |
| 1 | BANK 1 | BANK 0 |

FIG. 9

| X:$2^1,2^0$ / Y:$2^1,2^0$ | 0 0 | 0 1 | 1 0 | 1 1 |
|---|---|---|---|---|
| 0 0 | BANK 0 | BANK 1 | BANK 2 | BANK 3 |
| 0 1 | 1 | 2 | 3 | 0 |
| 1 0 | 2 | 3 | 0 | 1 |
| 1 1 | 3 | 0 | 1 | 2 |

TWO DIMENSIONALLY ADDRESSABLE MEMORY APPARATUS WITH BANK SWITCHING

BACKGROUND OF THE INVENTION

The present invention relates to a memory apparatus which is divided into a plurality of memory banks and is managed by two-dimensional addresses.

In printers which print a two-dimensional pattern, such as a character pattern or the like, print data is not necessarily given in the order in which the data is outputted, but the data transmitted is outputted to specified locations in a page. Therefore, a control apparatus of such printers is provided with a memory having a capacity corresponding to a print paper and a dot pattern is printed at the specified locations corresponding to an output page. The memory corresponding to the print paper is managed by two-dimensional addresses (X, Y addresses) to make the memory locations correspond to the physical coordinates on the paper.

In such a print control apparatus, memories corresponding to a print paper consisting of as much as two pages are ordinarily provided since a method whereby the next page is stored while a certain page is outputted is generally adopted. In such a case, if the next one page is not completely stored while one page is being outputted, the printer will have been stopped, so that it is necessary to effect a high-speed memory access. Therefore, there is generally adopted a method whereby the memory is divided into two or more banks and data is sequentially read from or written into a plurality of memory banks, thereby enabling a plurality of banks to be seemingly simultaneously accessed. In such print control method, for example, a memory managed by two-dimensional addresses for storing print data is divided into two memory banks and the memory banks are switched by the least significant bit of the X address. In this case, the correspondence among the X address, Y address and memory banks is as shown in FIG. 1. When a bit $2^0$ of the X address is zero (namely, the X address is even) a bank 0 is selected, when the bit $2^1$ of X is 1 (X is odd) another bank 1 is selected.

In case of developing a character pattern in such a memory on a character unit basis, dot patterns are developed sequentially from the upper line to the lower line of a character as shown in FIG. 2. Similarly, in case of developing vertical lines as shown in FIG. 3 as well, dot patterns are developed sequentially from the upper line to the lower line. Namely, in case of developing a character or vertical lines, the memory is accessed in the state whereby the X address is fixed while sequentially updating the Y address, so that memory requests are concentrated into one memory bank (memory bank 0 in FIGS. 2 and 3).

FIG. 4 shows a time chart showing situations of access to each memory bank in the cases where the X address is updated and where the Y address is updated in the above-described conventional print control apparatus. As shown in FIG. 4(a), in the case where the Y address is fixed and only the X address is updated, the banks 0 and 1 are alternately accessed. However, as shown in FIG. 4(b), in the case where the X address is fixed and only the Y address is updated, only one memory bank is continuously accessed, so that in spite of the fact that the memory is divided into two memory banks, the whole memory access time is substantially equal to that in the case where a memory is not divided into banks.

To cope with such a problem, a method whereby the apparatus is modified such that the memory banks are switched by the Y address is also considered. However, in case of developing horizontal lines or the like, the Y address is fixed and only the X address is continuously updated; thus, access requests are likewise concentrated into one memory bank as well.

SUMMARY OF THE INVENTION

It is an object of the present invention to provide a memory apparatus which disperses a memory access to a plurality of memory banks.

The present invention is constituted in such a manner that a memory bank is selected on the basis of lower significant bits including at least the least significant bits in respective X and Y addresses and a different memory bank is selected and designated whenever either one of the lower significant bits in the X and Y addresses is changed.

BRIEF DESCRIPTION OF THE DRAWINGS

FIG. 1 is a diagram showing the correspondence relation among X and Y addresses and each memory bank in a conventional example;

FIGS. 2 and 3 are diagrams showing the sequences at which a character pattern is allocated in a memory;

FIG. 4 is a time chart showing a memory access according to a conventional example;

FIG. 8 is a diagram showing the relation among X and Y addresses and a bank to be accessed in an arrangement of two banks; and FIG. 9 is a diagram showing the relation among X and Y addresses and a bank to be accessed in an arrangement of four banks.

DESCRIPTION OF THE PREFERRED EMBODIMENTS

One embodiment of the present invention will now be described hereinbelow with reference to the drawings.

Figure 5:
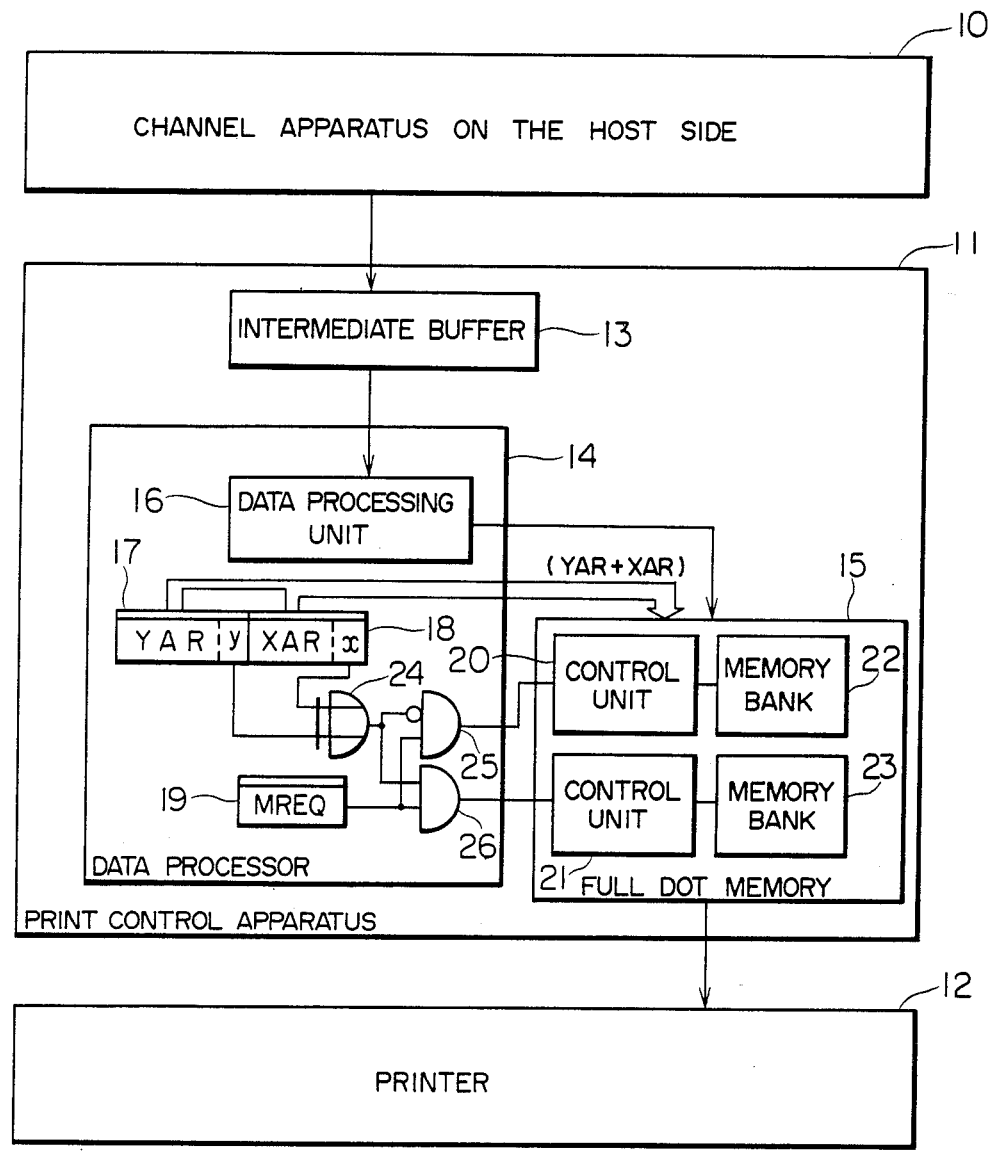
FIG. 5 is a block diagram showing one embodiment of the present invention.

FIG. 5 is a block diagram showing one embodiment of the present invention. In this diagram, a reference numeral 10 denotes a channel apparatus on the host side; 11 is a print control apparatus; and 12 is a printer. Binary coded print data sent from the channel apparatus 10 to the print control apparatus 11 is taken into an intermediate buffer 13 in the print control apparatus 11. A data processing unit 16 in a data processor 14 generates dot patterns corresponding to the binary coded print data and writes the dot patterns into a full dot memory 15. The memory 15 has a memory capacity to store two output pages, for example and is divided into two memory banks 22 and 23. Control units 20 and 21 are provided for the respective memory banks 22 and 23. The output pages stored in the full dot memory 15 are sequentially sent to the printer 12 and printed.

In the data processor 14, addresses in the memory 15 are managed by two-dimensional addresses consisting of Y and X addresses in correspondence to a print paper. A Y-address register 17 and an X-address register 18 are also provided. An exclusive OR gate 24 together with AND gates 25 and 26 constitutes a circuit to perform a change-over control of the memory banks in the memory 15. The least significant bit y in the register 17 and the least significant bit x in the register 18 are inputted to the exclusive OR gate 24. An output of the gate 24 is transmitted to one input of each of the AND gates 25 and 26, respectively. A latch 19 is set when a request to the memory 15 is generated. An output of the latch 19 is transmitted to the other input of each of the AND gates 25 and 26, respectively. Outputs of the AND gates 25 and 26 are inputted to the control units 20 and 21 as request signals to the memory banks 22 and 23, respectively.

In such an arrangement, when the output of the latch 19 is "1", (1) when y=0 and x=0, the output of the AND gate 25 is on and the memory bank 22 in the full dot memory 15 is accessed, (2) when y=0 and x=1, the output of the AND gate 26 is on and the memory bank 23 is accessed, (3) when y=1 and x=0, the output of the AND gate 26 is on and the memory bank 23 is accessed, and (4) when y=1 and x=1, the output of the AND gate 25 is on and the memory bank 22 is accessed.

Figure 6:
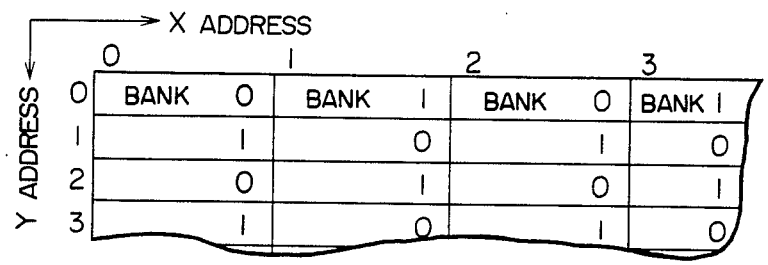
FIG. 6 is a diagram showing the relation among X and Y addresses and each memory bank according to one embodiment of the invention.
Figure 7:
FIG. 7 is a time chart showing a memory access according to one embodiment of the invention.

Namely, the memory banks 22 and 23 and the X and Y addresses are made to correspond to each other as shown in FIG. 6. Even in the case where only the X address is updated or where only the Y address is updated, two memory banks are alternately accessed as shown in a time chart of FIG. 7. Therefore, as in the case where dot patterns as shown in FIGS. 2 and 3 are developed or where a dot pattern of horizontal lines is developed, even if the X or Y address is fixed and only the other address is continuously updated, access requests are prevented from being concentrated into only one memory bank. Thus, the memory access time can be reduced as compared with a conventional arrangement and the number of memory access times which can be performed within a constant time period can be increased. The use efficiency of the full dot memory 15 can be substantially doubled as compared with the foregoing conventional system. Each memory bank can have a plurality of memory integrated circuits and by connecting a signal from the control unit with a chip enable terminal of each IC, it is possible to effect access to all of the IC memory included in the selected memory bank.

FIG. 8 shows the relation among the values of the least significant bit $2^0$ in the X address and of the least significant bit $2^0$ in the Y address and a bank to be accessed in case of the foregoing arrangement of two banks.

Although the case where a memory is divided into two memory banks has been described in the above, the present invention can be similarly applied as well to the case where a memory is divided into three or more memory banks. FIG. 9 shows the case where the memory is divided into four memory banks. In the case of four banks, a bank is selected by the two lower significant bits ($2^0$ and $2^1$ bits) in both X and Y addresses. As will be apparent from FIG. 9, in any case where the Y address is fixed and the X address is updated or where the X address is fixed and the Y address is updated, a different bank is accessed. In the case of using n bits from the X and Y addresses for selection of a bank, respectively, $2^n$ or less banks can be selected.

The present invention is not limited to the full dot memory in the print control apparatus, but may be likewise applied to an access control of a memory which is managed by two-dimensional addresses and is divided into a plurality of banks.

As will be obvious from the above description, according to the present invention, in a memory which is managed by two-dimensional addresses and is divided into a plurality of memory banks as a full dot memory in the print control apparatus, the memory access can be dispersed to a plurality of memory banks. Therefore, the memory access time can be reduced and the number of memory access times which can be performed within a constant time period can be increased.

We claim:

1. A memory apparatus which is managed by two-dimensional addresses consisting of X and Y addresses, comprising:

a memory divided into a plurality of memory banks;

address registers into which X and Y addresses to access each of said memory banks of said memory are set; and bank switching control means for selecting one of said memory banks, including an exclusive OR gate connected to receive the least significant bit in each of said X and Y addresses and selection means for selecting a different memory bank in response to an output of said exclusive OR gate whenever either one of the X and Y addresses is changed.

* * * * *